United States Patent [19]

Deak et al.

[11] Patent Number: 5,123,849
[45] Date of Patent: Jun. 23, 1992

[54] CONDUCTIVE GEL AREA ARRAY CONNECTOR

[75] Inventors: Frederick R. Deak, Kernersville; John R. Rowlette, Sr., Clemmons, both of N.C.

[73] Assignee: AMP Incorporated, Harrisburg, Pa.

[21] Appl. No.: 698,744

[22] Filed: Jun. 13, 1991

Related U.S. Application Data

[63] Continuation-in-part of Ser. No. 613,195, Nov. 15, 1990, Pat. No. 5,037,312.

[51] Int. Cl.$^5$ ............................................. H01R 9/09
[52] U.S. Cl. ............................. 439/66; 439/91; 439/591
[58] Field of Search ................... 439/66, 68–70, 439/74, 86, 91, 178, 485, 487, 591

[56] References Cited

U.S. PATENT DOCUMENTS

| | | | |
|---|---|---|---|
| 3,648,002 | 3/1972 | Du Rocher | 439/91 |
| 4,770,641 | 9/1988 | Rowlette | 439/178 |
| 4,988,306 | 1/1991 | Hopfer, III et al. | 439/66 |
| 5,007,843 | 4/1991 | Smolley | 439/66 |
| 5,037,312 | 8/1991 | Casciotti et al. | 439/66 |
| 5,074,799 | 12/1991 | Rowlette, Sr. | 439/91 |

Primary Examiner—Paula A. Bradley

[57] ABSTRACT

An electrical connector (30) includes a body (34) of elastomeric material having cavities (38) containing a conductive gel (42) operable upon deformation of the body of said connector to interconnect conductive pads (14, 22) between components such as a printed circuit board (12) and a chip carrier (18). An alternative embodiment uses a connector body (34') comprised of a sheet (48) of a low thermal coefficient of expansion material with separate inserts (50) of a higher thermal coefficient of expansion fitted in sheet perforations (49).

4 Claims, 6 Drawing Sheets

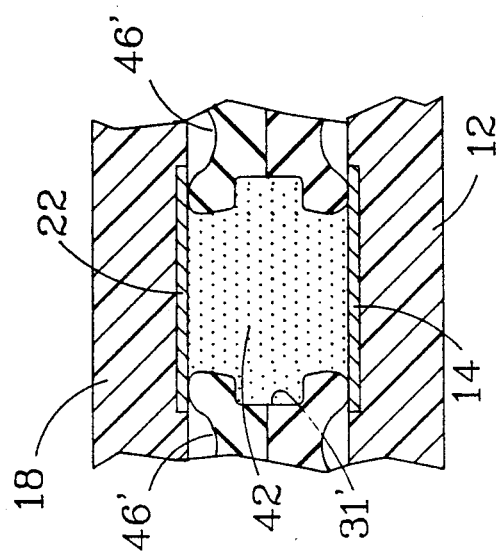
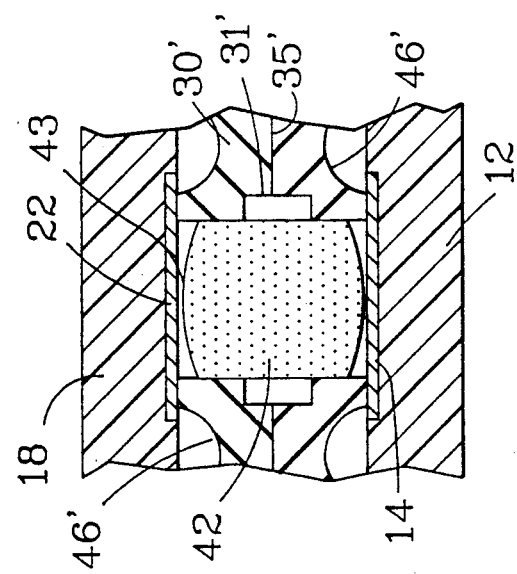

CONDUCTIVE GEL AREA ARRAY CONNECTOR

This is a continuation-in-part of U.S. patent application Ser. No. 07/613195 filed Nov. 15, 1990 now U.S. Pat. No. 5,037,312.

This invention relates to an electrical connector for interconnecting multiple conductive paths in an area array which employs a conductive gel held in an elastomeric material body.

BACKGROUND OF THE INVENTION

U.S. Pat. No. 4,770,641 granted Sep. 13, 1988 deals with a conductive gel interconnection apparatus which is used to establish electrical interconnection between a plurality of associated conductors such as wires, conductive traces on printed circuit boards, pin grid arrays or other components where there are closely spaced conductors positioned in an array on a substrate. The apparatus uses an insulative body having one or more open-ended cavities containing a conductive gel which is brought into contact with two discrete electrical elements to provide an interconnection therebetween. The patent deals with a disconnectable type of connector and with a particular type of gel which, while conforming to the housing cavities in which it is used, is sufficiently coherent and viscous that it will not flow from the cavity, and upon disconnection of the elements will return to its original shape and remain within the housing cavities.

The advantage of the foregoing mentioned patent in one major respect is that the so-called contact forces of engagement, or forces of withdrawal from the gel, are minimal as compared with traditional connectors. Specifically, traditional electrical connectors require normal forces of interconnection in the range between 50 grams for gold plated contacts to over 200 grams for tin plated contacts, as bare minimums for connectors which experience modest environments. Conductive gel involve normal forces of a few grams for the gel connect and disconnect functions.

The present invention has as an object an improvement over the foregoing mentioned patent with respect to the provision of conductive gel interconnections. A further object is to provide an area array connector which can be connected and disconnected with minimum forces of engagement to allow high numbers of contact points such as experienced in pin grid arrays to be interconnected and disconnected repeatedly. A still further object is to provide an inexpensive, area array, interposer type interconnection system for packaging electrical and electronic components such as integrated circuits. A still further object is to provide a high compliance, low-force and environmentally sealed connector in an inexpensive package.

SUMMARY OF THE INVENTION

The present invention meets the foregoing objectives by providing a connector body of elastomeric material having one or more cavities therein containing a conductive gel. The connector body is given a geometry relative to the cavity in the gel such that it can be deformed by a compression between two conductive pads to diminish the volume of the cavity causing the gel to come in intimate contact with the pads. Projecting lips formed of the elastomeric material of the body of the connector project around a cavity so as to be readily deformable to seal the interconnection between gel and conductive pad environmentally and limit the flow of gel under the force of pressure when used to effect an interconnection. The invention contemplates a connector body formed of an elastomeric material with arrays of cavities, each containing gel and each containing the aforementioned geometry to interconnect contact paths between an integrated circuit component such as an area of grid array and a printed circuit board forming part of a complex electronic circuit. Embodiments are presented wherein cavity shapes are readily deformable to compensate for gel flow and pressure to readily accommodate closure tolerances. Other embodiments are included which show cavities relieved to accommodate gel flow and an embodiment is included which includes a conductive mass within a cavity which operates to reduce the overall bulk resistance of the displaced gel material. Finally, an embodiment is included which uses a sheet of plastic material having a relatively low thermal coefficient of expansion, perforated to contain elastomeric inserts including gel cavities with the sheet of plastic material minimizing misalignment of inserts relative to thermal expansion.

IN THE DRAWINGS

FIG. 3 is a section taken along lines 3—3 of the connector shown in FIG. 2 in a condition of initial closure of components;

FIG. 5 is a section of an alternative embodiment of the invention in an unactivated condition;

FIG. 6 is a sectional view of the elements of FIG. 5 following activation and compression;

DETAILED DESCRIPTION OF THE INVENTION

In the description hereinafter given, reference will be made to a conductive gel and to elastomeric materials. The characteristics of these materials are important to the functionality of the invention and while broad variations in the characteristics are important. The conductive gel referred to is one that will have a memory-like viscosity such that it will accept numerous intermating geometric forms and will conform to the surface area of conductors to be intermated. The gel should flow under pressure but return to its original shape when the pressure is removed. The conductive gel should not stick to conductive pads or other conductors when driven to flow against and interconnect with such. And, of course, a conductive gel must be conductive. In a preferred embodiment, a gel known under the trademark SYLGARD 527, manufactured by Dow Corning Corporation, which is a two-part system, was mixed in a one-to-one ratio and cured to form a cushioning, selfhealing and resilient gel-like mass. The gel was made conductive by a fill of conductive particles distributed therein and conductive particles included silver coated nickel particles and/or silver coated glass particles and in certain cases, solid silver spheres or silver flakes. A fill of particles on the order of between 20 and 40 percent by volume of particles to volume of dielectric material operates to provide a conductivity threshold on the order of 20 to 30 percent by volume in the dielectric medium. The elastomer utilized was also a Dow Corning material known as Dow Corning silicon 595. This material was L.I.M. molded to provide a 40 durometer on the Shore A Scale and was found to be sufficiently resilient for the use to be described.

Figure 1:
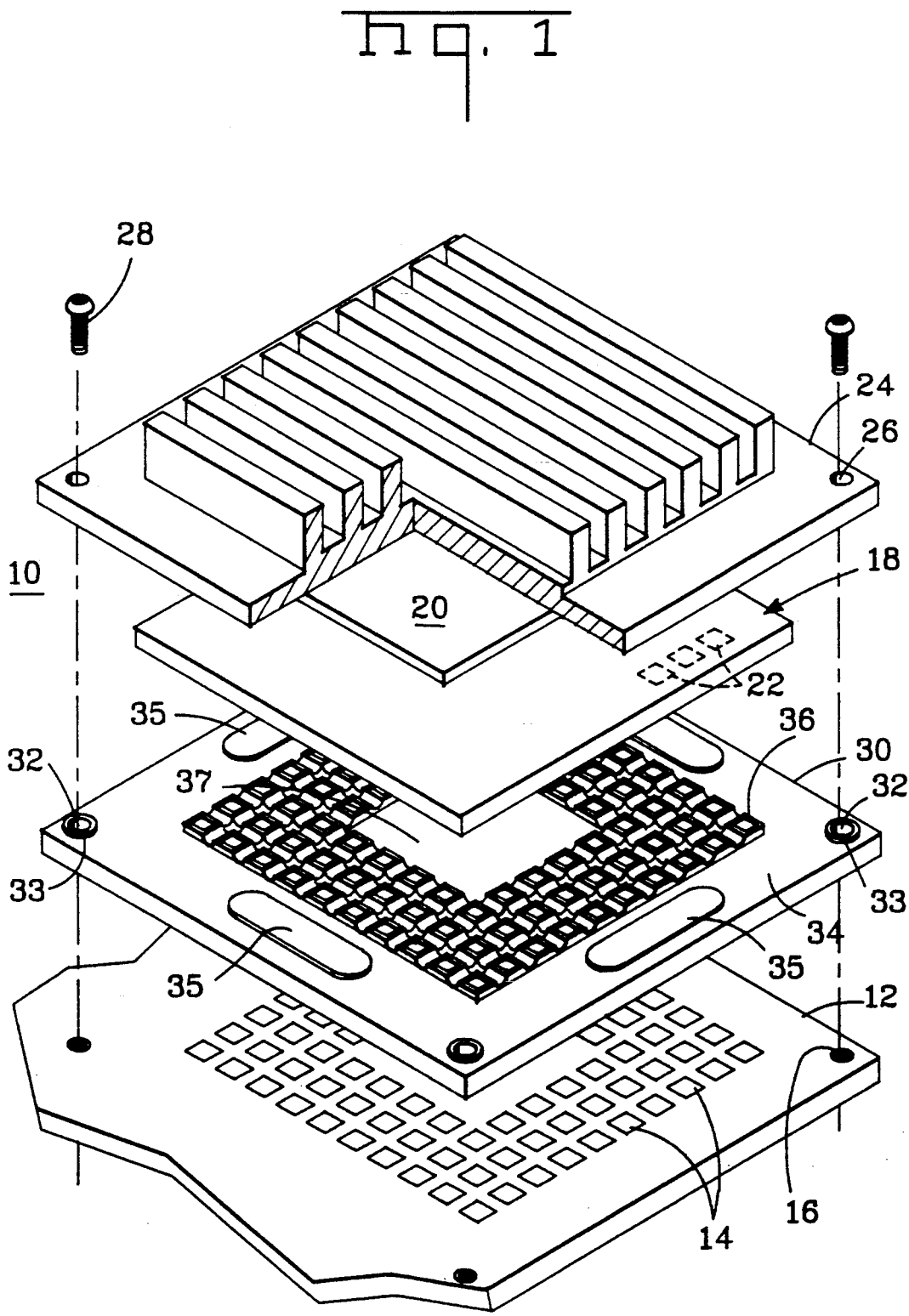
FIG. 1 is an exploded perspective, considerably enlarged, showing the invention connector in relation to a multi-layer printed circuit board, a chip carrier, and a heat sink.

Referring now to FIG. 1, an assembly 10 is shown to include a printed circuit board 12, representing a multi-layer printed circuit board typical of use in complex electronic circuits, a conductive, elastomeric grid array 30, a chip carrier 18 and a heat sink 24. These elements in use are fitted together and held together by virtue of fastening means passed through apertures on the edges of the elements and clamped by fasteners such as 28 shown in FIG. 1. The multi-layer board 12 includes a series of conductive pads 14 extending on the upper surface thereof in arrays on given centers and interconnected to conductive layers within the body of 12 to interconnect to further components to form useful functions. The chip carrier 18 shown in FIG. 1 includes in the center thereof a large scale integrated circuit mounted on a substrate such as a ceramic or plastic substrate having an array of conductive pads on the bottom surface thereof, several such pads shown in phantom as 22 in FIG. 1. A circuit sink 20 is bonded to the upper surface of 18. The various circuits within 18 are interconnected by traces not shown to the various pads 22. The heat sink 24 operates to conduct heat from the circuit sink 20 and dissipate such through fins on the upper surface thereof.

The pads 22 of the chip carrier 18 are on centers corresponding to the centers of pads 14 on the board 12 and are typically plated to provide an oxide-free surface. Between the chip carrier 18 and the board 12 is the grid array connector 30 formed of an elastomeric material. At the corners around the periphery of the body of the connector 30 are apertures 32 which correspond to apertures 16 of board 12 and 26 of the heat sink 24 and through which pass the fasteners 28 to lock the elements together and to board 12. The body of the connector, molded of elastomeric material, includes a series of rigid spacers such as 33 shown surrounding the apertures 32 and further spacers 35 embedded with the outer edges 34 of the connector. These spacers set precisely the spacing between the pads 22 of the chip carrier 18 and the pads 14 of board 12 by limiting the compression of the connector 30.

Figure 2:
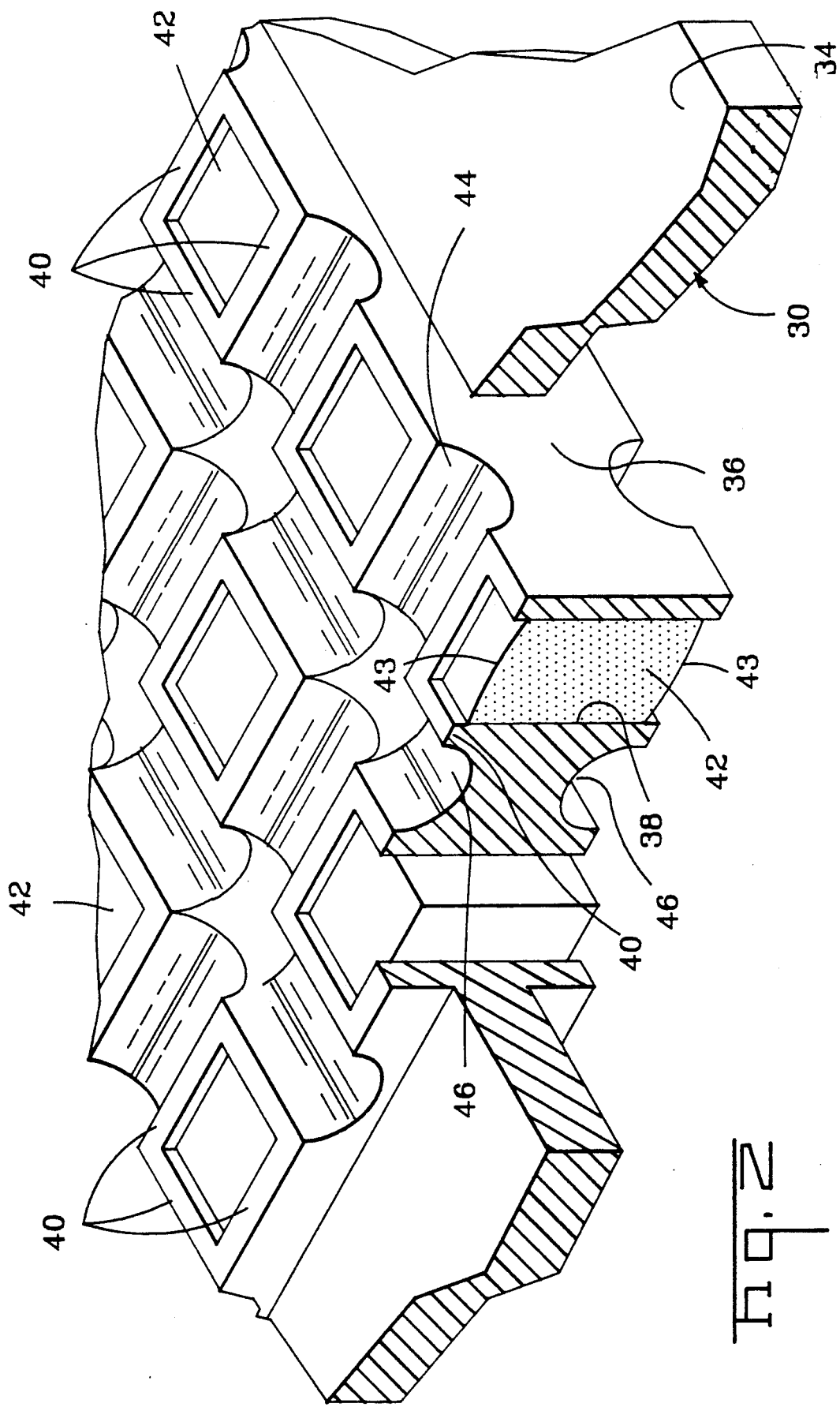
FIG. 2 is a perspective of a segment of the connector shown in FIG. 1, considerably enlarged therefrom.

As can be seen in FIG. 1 and in more detail in FIG. 2, the connector 30 includes a center region 37 which is cut away to receive the body of the integrated circuit 18 when the elements are clamped together. Center region 37 may be replaced with a thermally conductive medium's e.g. an elastomer having that property (Dow Corning Q 36605), to provide additional heat dissipation from a semi conductor device to a thermally conductive substrate. Surrounding the cut away portion 37 are a series of projections 36 which extend in the manner shown in FIG. 2 above the surfaces of 34 and below such surfaces to define cavities 38. Each of the projections 36 include at the ends thin ribbed lips 40 surrounding the cavities. Within each cavity is disposed a conductive gel 42 which may include a slight meniscus 43 as better shown in FIG. 3 or may be flat. The projections of 36 to define lips 40 are further defined by a grid of channels which intersect, including channels 44 which run parallel across the connector 30 in one direction and the channels 46 which run transverse thereto, both as shown in FIG. 2. The lack of material defined by the presence of the channels 44 and 46 in conjunction with the dimensions of the cavities 38 and lips 40 provide a geometric body defining the force travel characteristic of the elastomeric material of the connector under pressure. The material itself, of course, provides another variable in terms of the force required to deform the material a given dimension. Put another way, a material with a given durometer such as for example, a durometer of 40 on the Shore A scale will give a given characteristic of force and deformation per unit volume. Alterations in the geometry or the unit volume will result in comparable alterations in the amount of force required to deform the particular body. Deformation of the elastomer accounts for most of the force of engagement, the gel itself very little.

The purpose of the assembly 10 is to interconnect the circuits within the integrated circuit 18 to the conductive paths of board 12 and thus to define various circuit functions.

Referring now to FIG. 3, the conductive pads 14 and 22 are shown aligned and positioned with the surfaces of chip carrier 18 and board 12 just touching the connector and prior to any deformation thereof. As can be seen in FIG. 3, the gel 42 rests within cavity 38 with its surfaces down within the cavity. As can be seen, the gel 42 has a meniscus 43 on each end, however, the surface may be flat if desired. In the condition shown in FIG. 3, the pads 14 and 22 are not interconnected and are isolated electrically. It is to be understood that in certain instances, particularly after use, the gel 42 may be displaced to one end or the other rather than as shown but will, in accordance with its characteristics in a relaxed condition, remain out of contact with one or the other of the pads 14 or 22 maintaining the open or disconnected condition.

Figure 4:
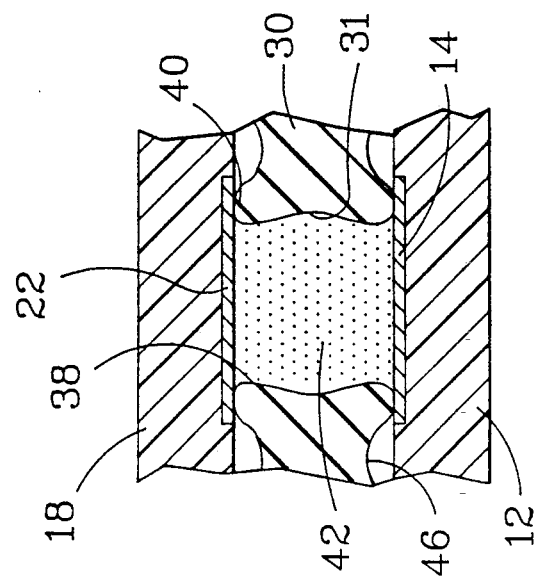
FIG. 4 is a section of the element shown in FIG. 3 as compressed to provide an interconnection.

FIG. 4 shows the elements of FIG. 3 in an activated or connected condition, driven relatively together by the fasteners 28 being screwed into the apertures 16 of the board 12. In practice, the screws are turned until the spacers 33 and 35 bottom out against the surfaces of the chip carrier 18 and the board 12. As mentioned, this limits the deformation that can occur to the connector 30. In FIG. 4, the material of the connector can be seen to be deformed top and bottom with the lips 40 deformed in a manner to seal the gel 42 within the cavity 38. The elastomeric nature of the material from which 30 is formed allows the body to further deform, driving the gel slightly axially outward, top and bottom, of the cavity to contact the pads 14 and 22 and effect an interconnection therebetween. Closure between the elements 12 and 18 is controlled to achieve a deformation resulting in broad area contact between the gel and the pads 14 and 22 to provide a stable, low resistance interconnection. As can be discerned from FIG. 4, the invention contemplates an elastomer sufficiently resilient to bow slightly outward as at numeral 31 to relieve the criticality of tolerance with respect to the spacers 33 and 35 by allowing the gel to expand within the cavity without being forced to pass the lip seals and thus spread on the surfaces of board 12 and the chip carrier.

Deformation of the lips readily facilitates most of the displacement of the elastomer.

Upon release of the fasteners 28, the elements shown in FIG. 4 will return to the condition shown in FIG. 3, the gel withdrawing into the cavity to its original geometry and configuration. One of the characteristics of the gel is that it wets to the surface of the conductive pads sufficient to provide contact but it wets to the elastomer even moreso to stay with the cavity.

Referring now to FIG. 5, an embodiment of the invention is shown wherein the connector 30' is made of two halves laminated and bonded together as at 30'. As will be discerned, the cavity 38 includes interior expanded diameters in the halves to form a relieved volume surrounding the cavity as at 31'. FIG. 6 shows the elements of FIG. 5 activated and the resulting expansion of the gel 42 into the added volume 31' which allows flow of the gel under the deforming forces of the connector body 30'. The volume also serves to help hold the gel 42 within cavity 38 by allowing expansion of the gel into the cavity 31' as indicated by FIG. 5.

Figure 7:
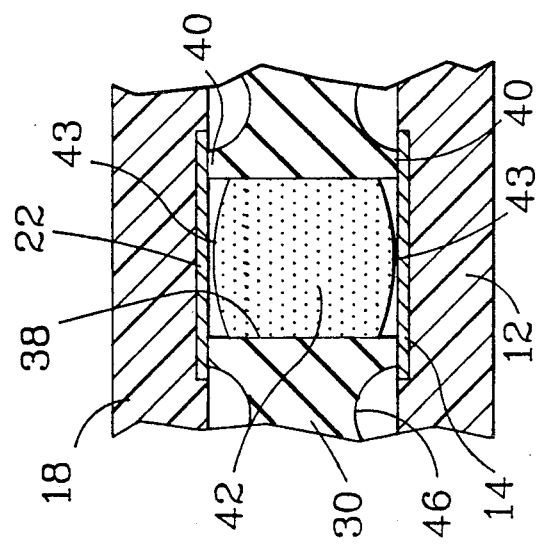
FIG. 7 is a further alternative of the invention shown in section prior to activation.
Figure 8:
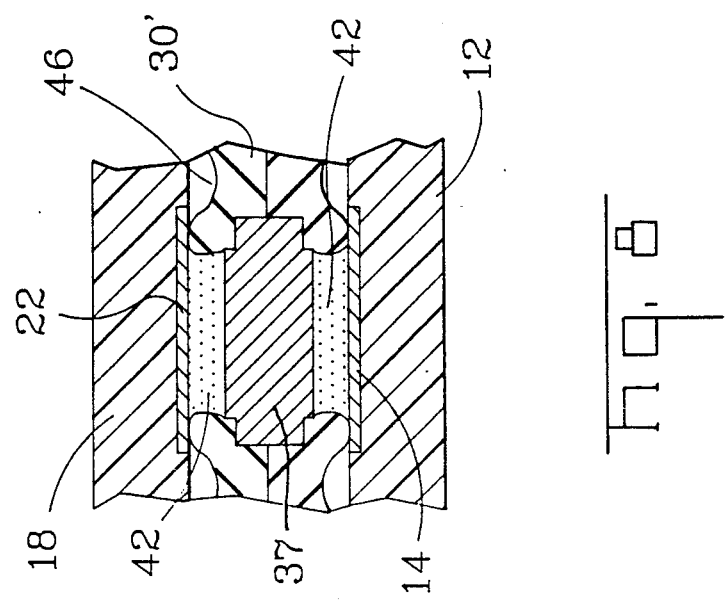
FIG. 8 is a view of the elements shown in section in FIG. 7 following activation.
Figure 7:
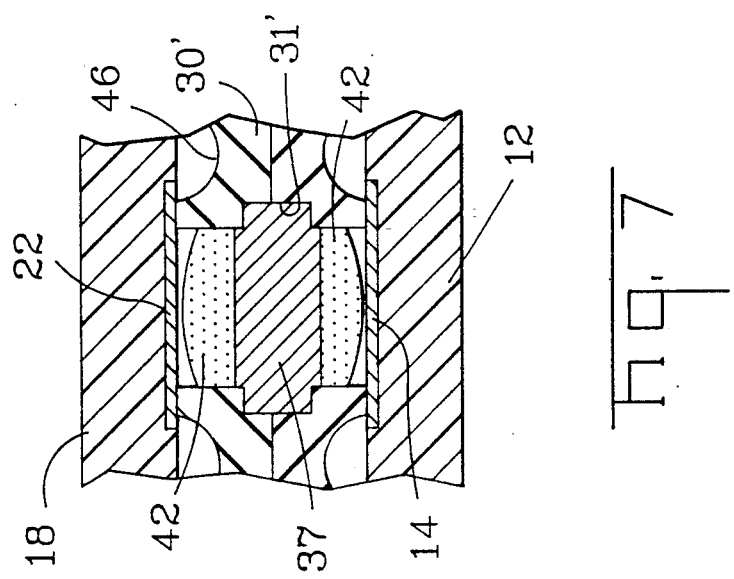
Figure 9:
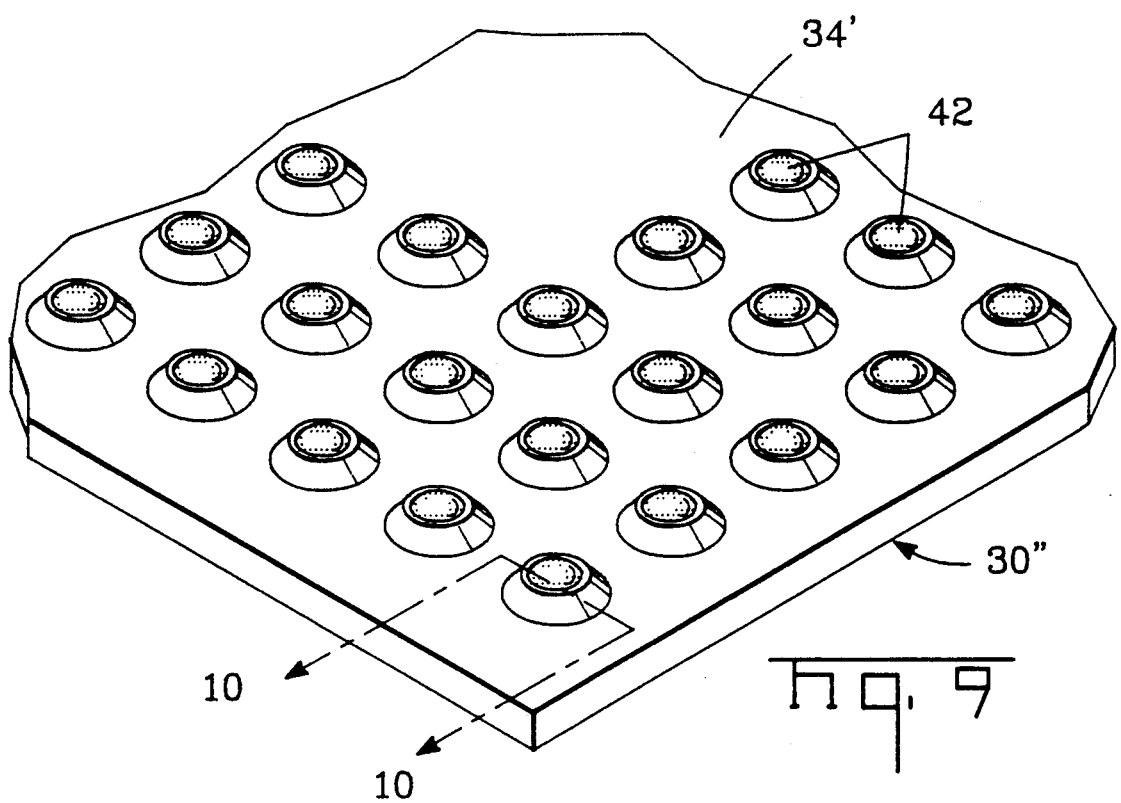
FIG. 9 is a perspective of a corner of a connector in an alternative embodiment of plastic material.
Figure 10:
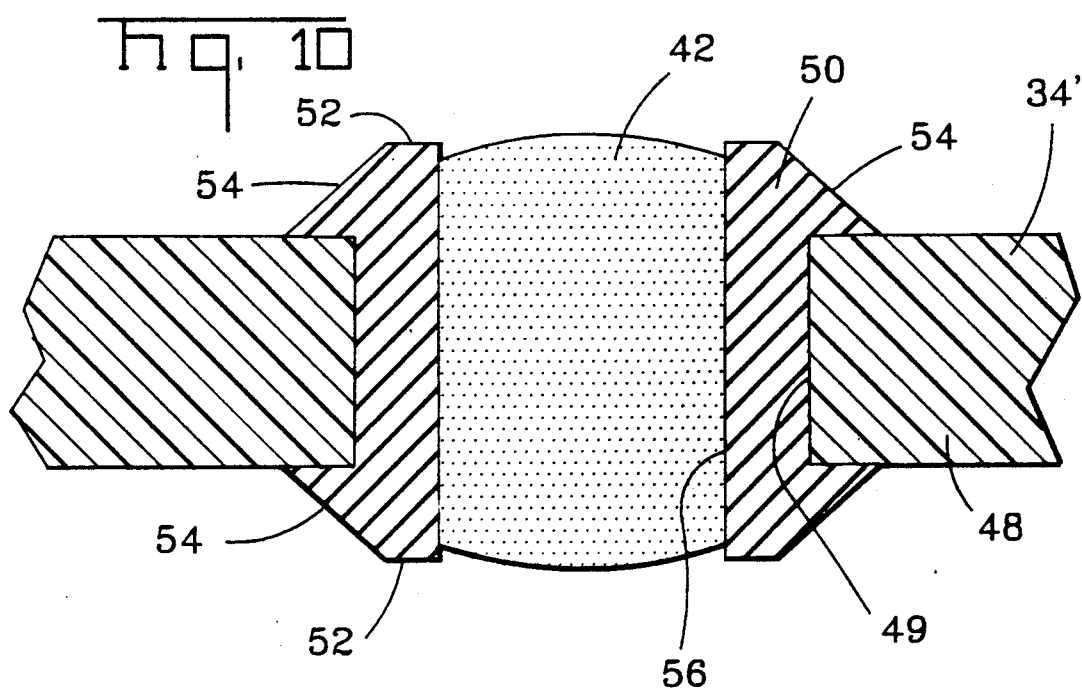
FIG. 10 is a cross-section, in elevation, taken along lines 10—10 of FIG. 9.

FIG. 7 shows a further embodiment of the invention wherein the connector body 30', including the recessed cavity 31', is made to include a solid metal slug 37, preferably of copper and silver plated so that the upper and lower surfaces thereof are electrically connected to the gel 42 on the upper and lower surfaces. As can be seen in FIG. 7, the gel as divided again conforms to the cavity with the meniscus 43 as before. Upon actuation of the fasteners, the connector 30' will deform as before so that the gel 42 contacts the contact pads 14 and 22. The electrical connection which results between the pads goes through the upper and lower portions of the gel and through the slug 37. The embodiment shown in FIGS. 7 and 8 is particularly useful wherein a lower resistance path is required than can be achieved than by the particular bulk resistance of the particular gel composition being employed. Connectors with extra long cavities which would require extra long paths of gel may very well utilize the embodiment shown in FIGS. 7 and 8. With respect to these embodiments, the slug 37 may, of course, have a greater length than is shown, and it is contemplated may have variations in the surfaces which are shown flat to increase the area of contact with the gel and/or increase the adhesion. The surfaces of the slug may also be roughened up, etched or pitted in a manner to increase wetability to the gel as well. It is contemplated that the cavities 38 may also be treated as by coating with adhesion enhancing materials to provide a wetability to the gel which is at least greater than the wetability of the surfaces of the contact pads 14 and 22 which are typically plated with gold or some other alloy having low oxidation characteristics. FIGS. 9 and 10 show an alternative embodiment of the invention adapted for use in applications wherein temperature extremes may be expected to cause differential thermal expansions of the several materials of which the components, connectors, and boards are made. With respect to the embodiment of FIGS. 9 and 10, an array connector 30" corresponds to array 30, shown in FIG. 1, but includes a two-part assembly with a body 34' comprised of a sheet 48 having perforations 49 to house inserts 50. The inserts each include lips 52 which are flattened on the opposed surfaces thereof and are beveled as at 54 to define a deformable sealing structure which is readily compressible as heretofore shown and described with respect to the embodiments of FIGS. 1-8. The inserts 50 have cavities 56 containing a gel 42, essentially but not quite filling the cavities and operable upon deformation of the inserts to cause the gel to flow and contact pads, not shown, but essentially identical to pads 14 and 22 heretofore described. The inserts 50 are locked to body 34' by virtue of annular grooves engaging the edges of the perforations 49.

In the embodiment of FIGS. 9 and 10, the sheet 48, including body 34', is comprised of material having relatively low thermal coefficient of expansion with the material of the insert 50 having a relatively higher thermal coefficient of expansion—each material selected for characteristics appropriate to use. The inserts must be highly elastomeric and flexible for easy deformation while the body 34' needs to have sufficient structural integrity and rigidity to maintain center-to-center positions for the inserts relative to the circuit path surfaces or contacts to be interconnected. Excessive expansion or contraction of the material of body 34 can displace the centers of the inserts to result in a mismatch with the contacts 14 and 22; or, at least a reduction in contact area with gel 42 in a given contact area. In a preferred embodiment for use with thermal extremes, the insert 50 was formed of a liquid silicon rubber, S.L.R., having excellent elastomeric and insulating qualities as well as wetability to the gel but with a thermal coefficient of expansion on the order of 250 parts per million (ppm) per degree C. In an embodiment wherein the body were formed entirely of L.S.R. material, a temperature spread of 100 degrees C. could cause a displacement from one end to the other of on the order of 0.025 inches for each inch of width of material. The invention assembly adapted for temperature extremes uses a liquid crystal polymer material, L.C.P., having a thermal coefficient of expansion on the order of 20 ppm for sheet 50 to preclude undue expansion and displacement of the gel cavities which are defined by inserts formed of L.S.R. material. This composite of material is preferred in applications wherein thermal extremes are present and misalignment of gel sites relative to contact pads is expected. The use of a lower thermal coefficient of expansion material renders the connector thermally more like the components including integrated circuit packages and printed circuit boards employed with respect to the connector.

The invention contemplates a variety of shapes for the various cavities from rectangular to circular and so forth. The invention also contemplates a variety of shapes for the sealing lips 40 and 52.

The dimensions of the cavities and the volume of gel need to be adjusted to define an adequate resistance for the particular types of components being employed. A typical resistivity for a gel being employed is 1.2 times 10-3 ohm centimeters. The actual resistance of a given path can be calculated by dividing resistivity by the area of contact and multiplying the path length to yield resistance in ohms. In a working prototype of the invention for use in modest temperature applications, the connector body was formed of the previously mentioned Dow Corning material to a thickness on the order of 0.065 inches with the cavity 38 filled with gel to a degree to leave a space from the top of the gel to the top of the lips 40 on the order of 0.010 inches as measured from the edge of the gel within cavity 38. The gel and the cavity 38 had a diameter of 0.025 inches and the meniscus, as measured from the edge to the top center thereof had a dimension on the order of 0.003 to 0.007 inches. A deformation of the connector body on the order of 0.020 inches resulted in the cavity 38 being compressed to essentially fill the volume thereof with gel, leaving a path length on the order of 0.045 inches. While some deformation of the cavity did occur as heretofore mentioned, the resistance of the gel path was on the order of 75 milliohms, and resistances ranging between 50 and 100 milliohms can readily be achieved by volume and area changes coupled with changes to the composition of the gel. Resistances of these orders of magnitude are quite adequate for the bulk of electronic devices being employed presently which utilize very low power, low current and low voltage signals.

Prototypes of the invention having the foregoing dimensions were fabricated to include 227 cavities on 0.050 inch centers arrayed in 3 rows around the periphery of a package having the outside dimensions of 1.140 by 1.180 inches. This package is typically provided in a ceramic body to define a land grid array.

While the invention has been detailed and described relative to interconnecting contact pads, the invention contemplates interconnecting circuit paths of different configurations which, in one condition, are not interconnected by a gel, and in another condition through the deformation of an elastomer, brought into an interconnected condition through the said gel.

Having now described the invention in terms intended to enable a practice thereof in preferred modes, claims are set forth intended to define what is inventive.

We claim:

1. An electrical connector adapted to interconnect first and second planar elements each having contact surfaces arrayed in a pattern extending over a given planar area, the said connector including a connector body formed of a planar sheet of material coextensive with the said given area and including an array of perforations in a pattern corresponding to the pattern of contact surfaces, an insert fitted in each perforation and extending out from the surface of the said sheet, each insert having a cavity containing a conductive gel of a volume less than the volume of the cavity, and further characterized in that the said insert is of an elastomeric material readily deformable to cause the said gel to flow axially to interconnect the first and second contact surfaces, the sheet being comprised of a material having a thermal coefficient of expansion comparable to the thermal coefficient of expansion of the said first and second planar elements whereby to minimize misalignment of element contact surfaces and inserts.

2. The connector of claim 1 wherein the said sheet is an insulating material having a thermal coefficient of expansion on the order of less than 50 ppm per degree Centigrade.

3. The connector of claim 1 wherein the said sheet is of a material having a thermal coefficient on the order of 20 ppm per degree Centigrade.

4. The connector of claim 1 wherein the said insert is of a material having physical characteristics comparable to liquid silicon rubber and the sheet is of a material having physical characteristics comparable to a liquid crystal polymer material.

* * * * *